United States Patent [19]

Ovshinsky et al.

[11] 4,226,898
[45] Oct. 7, 1980

[54] AMORPHOUS SEMICONDUCTORS EQUIVALENT TO CRYSTALLINE SEMICONDUCTORS PRODUCED BY A GLOW DISCHARGE PROCESS

[75] Inventors: Stanford R. Ovshinsky, Bloomfield Hills; Arun Madan, Rochester, both of Mich.

[73] Assignee: Energy Conversion Devices, Inc., Troy, Mich.

[21] Appl. No.: 887,353

[22] Filed: Mar. 16, 1978

[51] Int. Cl.² .......................................... H01L 45/00
[52] U.S. Cl. ...................................... 427/39; 148/1.5; 357/2; 427/53.1; 427/85; 427/86; 427/87
[58] Field of Search ................... 148/1.5, 91; 357/2, 357/13, 20, 63; 427/53, 85, 86, 39, 87

[56] References Cited

U.S. PATENT DOCUMENTS

| | | | |
|---|---|---|---|
| 3,949,119 | 4/1970 | Shewchar | 427/86 |
| 4,047,976 | 9/1977 | Bledsoe | 148/1.5 |
| 4,064,521 | 12/1977 | Carlson | 427/248 A |
| 4,066,527 | 1/1978 | Tukagi | 427/86 |
| 4,068,020 | 1/1978 | Reuschel | 357/63 |
| 4,113,514 | 9/1978 | Pankove | 148/1.5 |

OTHER PUBLICATIONS

Brodsky, "Doping ... Semiconductor," *IBM Tech. Dir. Bull.*, vol. 19 No. 12 (5–1977), pp. 4802–4803.

Malhotra, "Effects ... Silicon," *Applied Physics*, 28, No. 1 (1–1976), pp. 47–49.
Widmer, "Epitaxial ... Vacuum," *Appl. Phys. Lett.*, vol. 5, No. 5 (9–1964), pp. 108–110.
Choo, "Hydrogen ... Ge," *Solid State Comm.*, vol. 25, pp. 385–387 (1978).

*Primary Examiner*—John D. Smith
*Attorney, Agent, or Firm*—Wallenstein, Spangenberg, Hattis & Strampel

[57] ABSTRACT

A method of making an amorphous semiconductor film or the like having desirable photoconductive and/or other properties comprises depositing on a substrate a solid amorphous semiconductor film including at least one element, by glow discharge decomposition of a compound containing said at least one element and at least one alterant element in an atmosphere separately containing at least one different alterant element, wherein the plurality of different alterant elements comprise at least fluorine and are incorporated in said amorphous semiconductor film during the deposition thereof yielding an altered amorphous semiconductor material having reduced density of localized states in the energy gap thereof so that greatly increased diffusion lengths for solar cell application are obtained and modifiers or dopants can be effectively added to produce p-type or n-type amorphous semiconductor films so that the films function like similar crystalline semiconductors.

57 Claims, 15 Drawing Figures

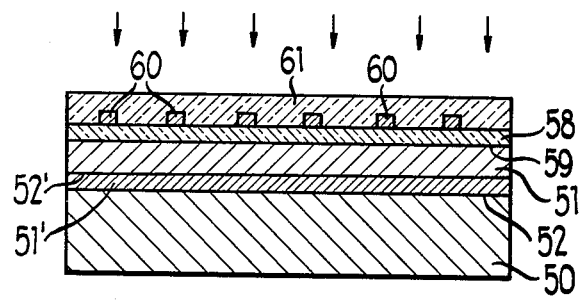
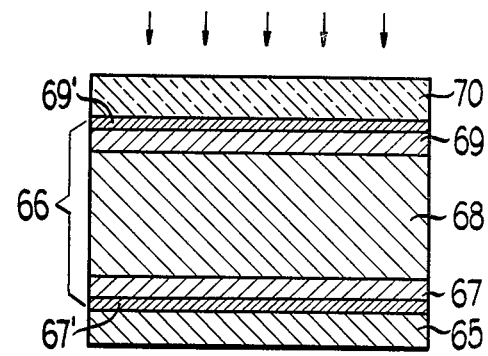
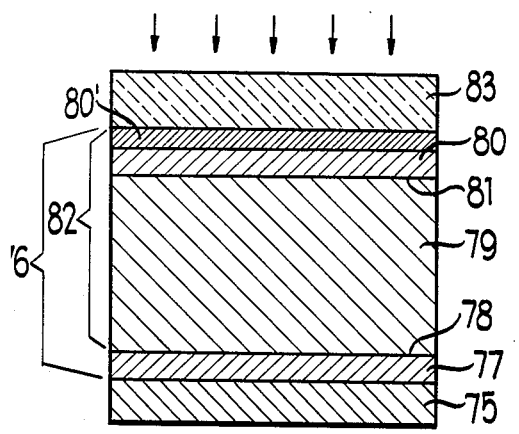
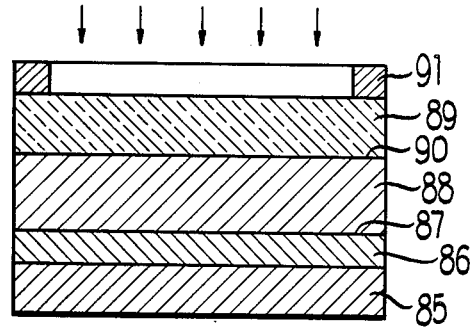
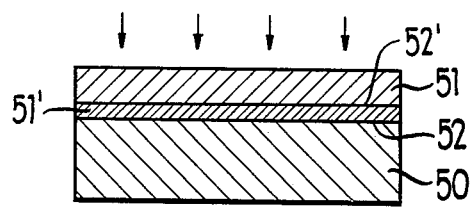
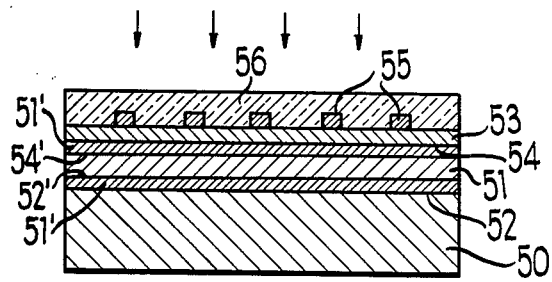

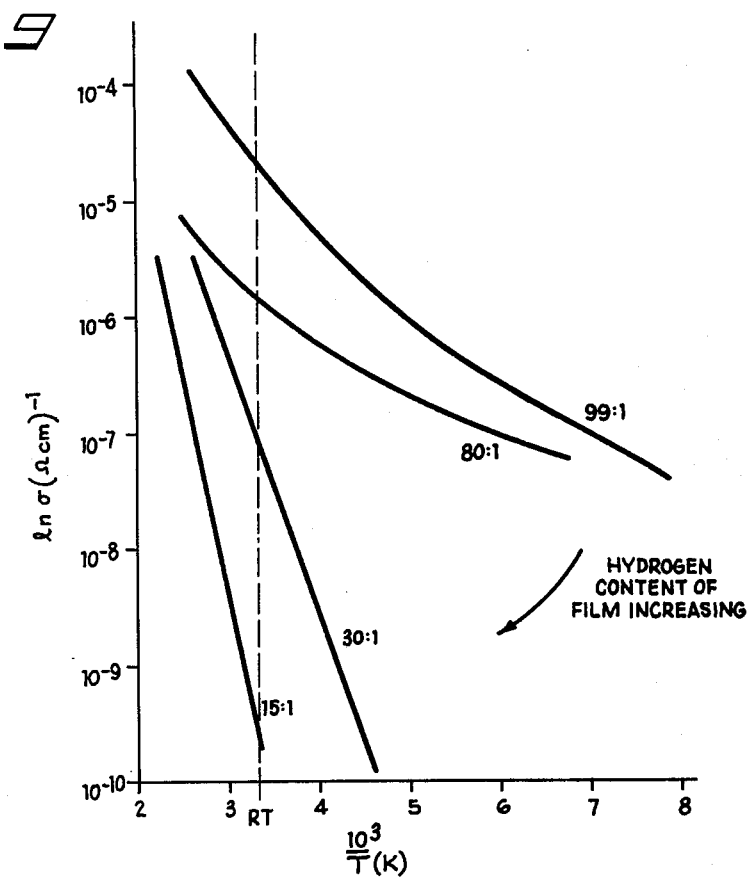
Fig 9
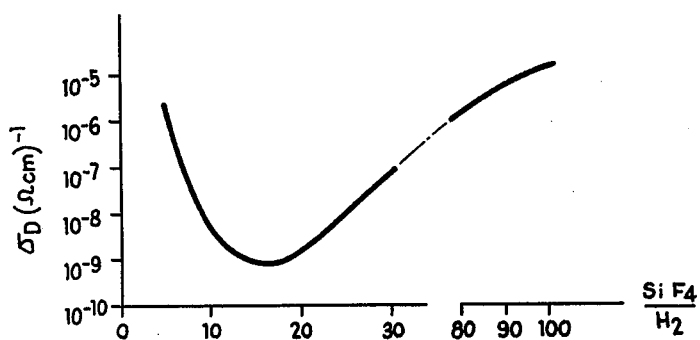
Fig 10
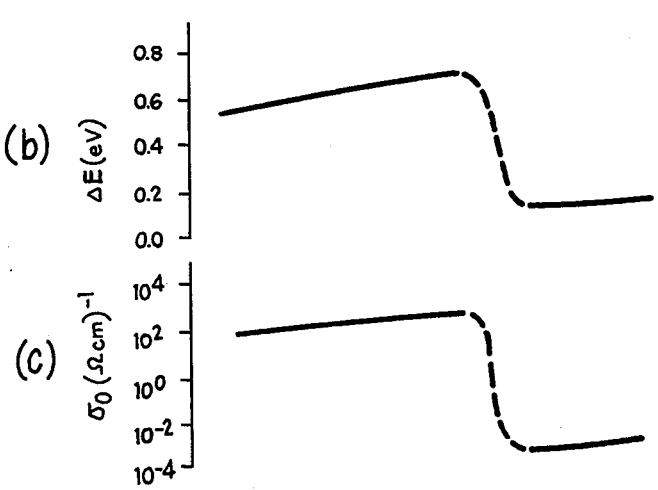

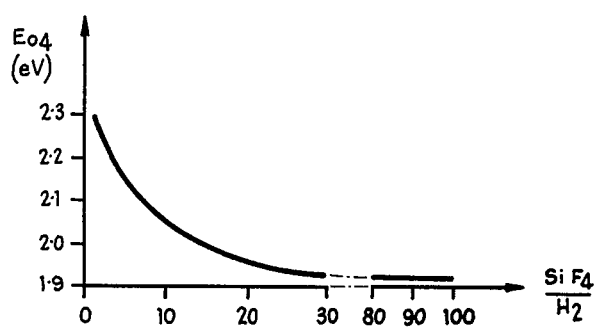
Fig 11
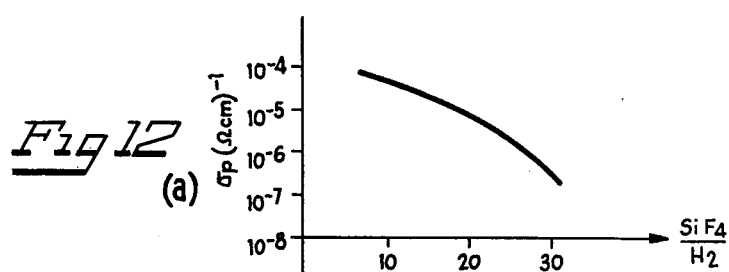
Fig 12
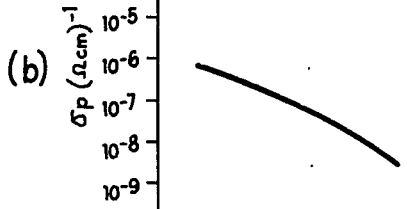
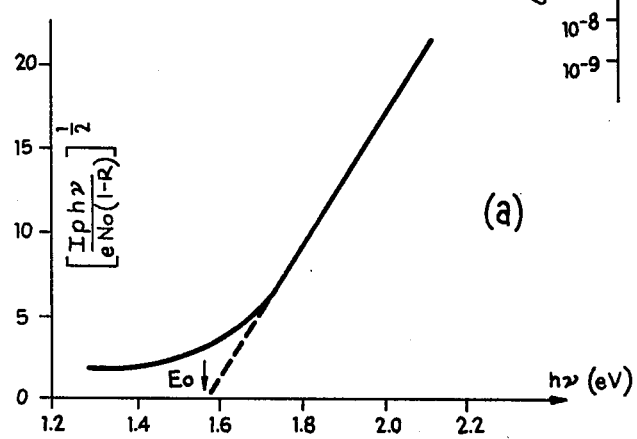
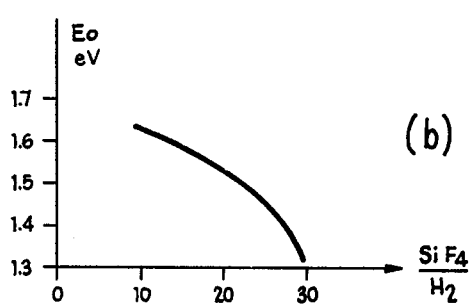
Fig 13

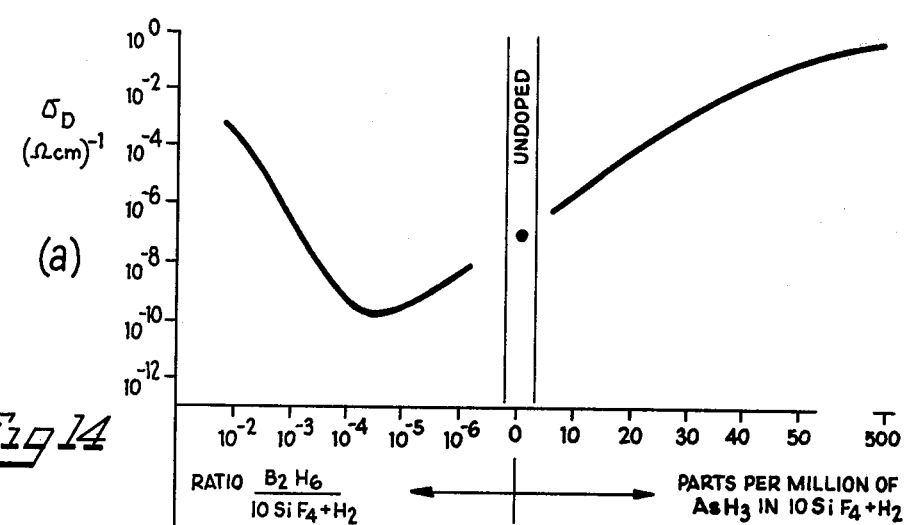
Fig 14
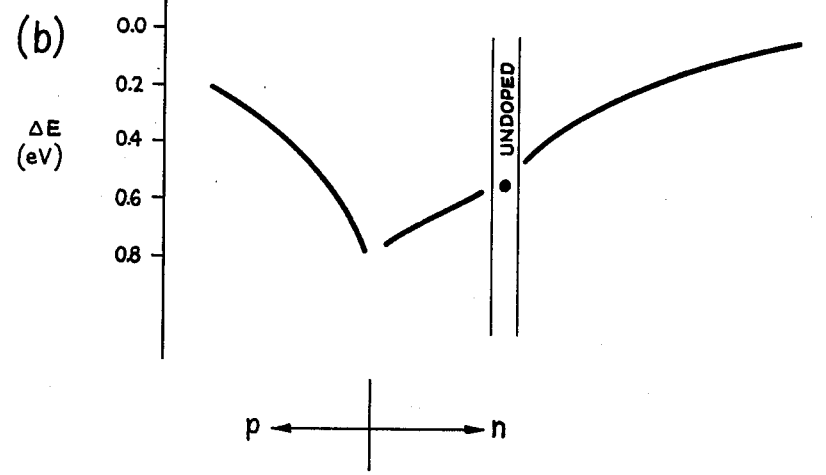
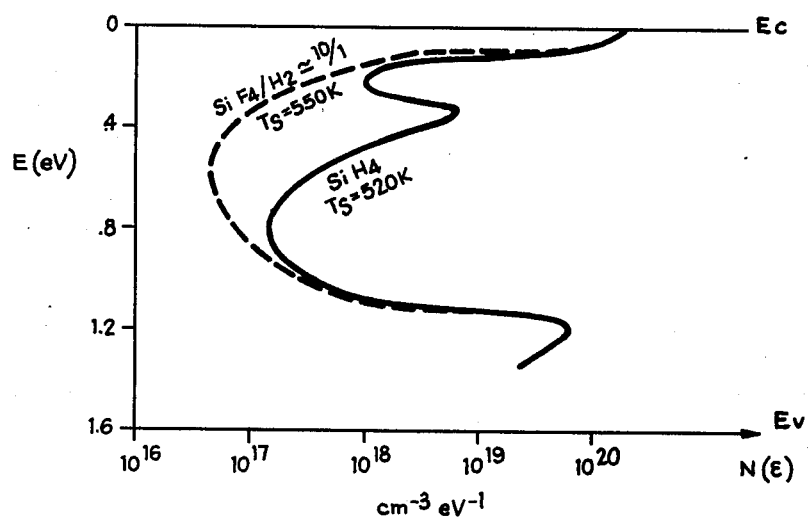
Fig 15

AMORPHOUS SEMICONDUCTORS EQUIVALENT TO CRYSTALLINE SEMICONDUCTORS PRODUCED BY A GLOW DISCHARGE PROCESS

The invention relates to methods which permit the reduction or elimination of localized states in the energy gap, such as dangling bonds, recombination centers, etc., in amorphous semiconductor films to provide improved amorphous semiconductor films which have characteristics like those found in corresponding crystalline semiconductors. The amorphous films involved have their most important utility in solar radiation energy-producing devices and current control devices, such as Schottky barrier and p-n junction devices including rectifiers, transistors or the like, where heretofore crystalline semiconductor bodies have been used in their fabrication.

The principles involved in the invention can be applied to various types of amorphous semiconductor films, both thick and thin films, which have recombination centers and other localized states inhibiting the control of the conductivity thereof, and are applicable to amorphous semiconductor films made of one or more elements, or combinations of elements which are mixtures or alloys of such elements. Silicon is the basis of the huge crystalline semiconductor industry and is the material which has produced expensive high efficiency (18 percent) crystalline solar cells and low cost, low-efficiency (5½ percent) polycrystalline solar cells. Since amorphous silicon-containing films, if made equivalent to crystalline silicon films, would have many advantages over such crystalline silicon films (e.g. lower cost, larger area, easier and faster manufacture), the main purpose of this invention is to overcome the barrier which has heretofore prevented materials such as amorphous silicon from having characteristics similar to crystalline silicon. Since this invention has overcome what up until now has been a severe obstacle to producing useful amorphous silicon films, we therefore initially deal with silicon films, although many aspects of the invention are also applicable to the production of films of various other amorphous semiconductor materials formed by elements including individual elements or mixtures or alloys of elements falling in Groups III through VI of the periodic table.

When crystalline semiconductor technology reached a commercial state, it became the foundation of the present huge semiconductor device manufacturing industry. This was due to the ability of scientists to grow substantially defect-free germanium and particularly silicon crystals, and then turn them into extrinsic materials with p-type and n-type conductivity regions therein. This was accomplished by diffusing into such crystalline material parts per million of donor or acceptor dopant materials introduced as substitutional impurities into the substantially pure crystalline materials, to increase their electrical conductivity and to control their being either of a p or n conduction type. The fabrication processes for making p-n junction and photoconductive crystals involve extremely complex, time consuming, and expensive procedures. Thus, these crystalline materials useful in solar cells and current control devices are produced under very carefully controlled conditions by growing individual single silicon or germanium crystals, and when p-n junctions are required, by doping such single crystals with extremely small and critical amounts of dopants. These crystal growing processes prduce such relatively small crystals that solar cells require the assembly of hundreds of single crystals to encompass the desired area of only a single solar cell panel. The amount of energy necessary to make a solar cell in this process, the limitation caused by the size limitations of the silicon crystal, and the necessity to cut up such a crystalline material has all resulted in an impossible economic barrier to the large scale use of crystalline semiconductor solar cells for energy conversion.

Accordingly, a considerable effort has been made to develop processes for readily depositing amorphous semiconductor films, each of which can encompass relatively large areas, if desired, limited only by the size of the deposition equipment, and which could be readily doped to form p-type and n-type materials where p-n junction devices are to be made therefrom equivalent to those produced by their crystalline counterparts. For many years such work was substantially unproductive. Amorphous silicon or germanium (Group IV) films were found to have microvoids and dangling bonds and other defects which produce a high density of localized states in the energy gap thereof. The presence of a high density of localized states in the energy gap of amorphous silicon semiconductor films results in a low degree of photoconductivity and short diffusion lengths, making such films unsuitable for solar cell applications. Additionally, such films cannot be successfully doped or otherwise modified to shift the Fermi level close to the conduction or valence bands, making them unsuitable for making Schottky barrier or p-n junctions for solar cell and current control device applications.

In an attempt to minimize the aforementioned problems involved with amorphous silicon and germanium, W. E. Spear and P. G. Le Comber of Carnegie Laboratory of Physics, University of Dundee, in Dundee, Scotland, did some work on "Substitutional Doping of Amorphous Silicon", as reported in a paper published in Solid State Communications, Vol. 17, pp. 1193-1196, 1975, toward the end of reducing the localized states in the energy gap in the amorphous silicon or germanium to make the same approximate more closely intrinsic crystalline silicon or germanium and of substitutionally doping said amorphous materials with suitable classic dopants, as in doping crystalline materials, to make them more extrinsic and of p or n conduction types. This was accomplished by glow discharge deposition of amorphous silicon films wherein a gas of silane ($SiH_4$) and a gas of phosphine ($PH_3$) for n-type conduction, or a gas of diborane ($B_2H_6$) for p-type conduction, were premixed and passed through a reaction tube where the gaseous mixture was decomposed by an r.f. glow discharge and deposited on a substrate at a high substrate temperature of about 500°-600° K. The material so deposited on the substrate is an amorphous material consisting of silicon and hydrogen and substitutional phosphorus or boron in dopant concentrations between about $5 \times 10^{-6}$ and $10^{-2}$ parts per volume. However, the electrical characteristics achieved by doping these materials did not reach the levels which make them commercially acceptable devices, such as solar cell devices, and current control devices including effective p-n junction devices and the like. The major scientific problem remained, i.e., the remaining states in the gap could not be eiliminated.

As expressed above, amorphous silicon, and also germanium, is normally four-fold coordinated, and normally has microvoids and dangling bonds, producing localized states in the energy gap. While it is believed that it was not known by these researchers, it is now known that the hydrogen in the silane combines at an optimum temperature with many of the dangling bonds of the silicon during the glow discharge deposition, to decrease substantially the density of the localized states in the energy gap toward the end of making the amorphous material approximate more nearly the corresponding crystalline material. However, the effect of the hydrogen was limited by the fixed ratio of hydrogen and silicon in silane as well as limiting the type of hydrogen bonding and introducing new anti-bonding states which can be of importance in these materials. Also, as above indicated, the density of the localized states was not reduced sufficiently to render these films commercially useful in solar cell or current control devices.

After the development of the glow discharge deposition of silicon from silane gas was carried out, work was done on the sputter depositing of amorphous silicon films in the atmosphere of a mixture of argon (required by the sputtering deposition process) and molecular hydrogen, to determine the results of such molecular hydrogen on the characteristics of the deposited amorphous silicon film. This research indicated that the hydrogen acted as an altering agent which bonded in such a way as to reduce the localized states in the energy gap. However, the degree to which the localized states of the energy gap were reduced in the sputter deposition process was insufficient to be useful for commercial purposes. The degree of reduction in the density of localized states achieved by this sputter deposition process was much less than that achieved by the silane deposition process described above, as would be expected since sputter and vapor deposition processes inherently produce amorphous films with much higher densities of localized states than does a glow discharge deposition process. This is the reason that prior to the present invention, it was not believed that sputter or vapor deposition processes could successfully produce amorphous semiconductor films functionally equivalent to similar crystalline materials used in solar cell and current control devices. Also, the sputtering process must be carried out under certain critical partial pressure limitations, and since such partial pressures are effected both by the amount of argon and hydrogen gas present, the amount of molecular gas which could be introduced into the sputtering atmosphere was accordingly limited.

The difficulty encountered heretofore in reducing the density of localized states in the energy gap of amorphous semiconductor materials like silicon and others to desirably low levels, so that these materials are the equivalent of corresponding crystalline materials, is believed to be explainable in the following manner. At or near the Fermi level of these materials deposited, for example, by the glow discharge of silane, are two bumps of relatively high density states in the energy gap which are apparently related to the remaining dangling bond density. They are located substantially at about 0.4 eV below the conduction band $E_c$ and above the valence band $E_v$. When the glow discharge amorphous silicon is doped with phorphorous or boron, the Fermi level is believed to be moved up or down, but the density of undersired localized states remains so high that the carrier life times are very short and the dopants could not move the Fermi level close enough to the conduction or valence bands, respectively, to yield an effective p-n junction. Thus, the conductivity activation energy for the doped glow discharge amorphous silicon was not lowered below about 0.2 eV. The fact that the Fermi level could not be moved closer to the respective band edges reduced appreciably the maximum obtainable open-circuit photovoltage of a p-n junction in such doped glow discharge amorphous silicon deposited from silane. In addition, the remaining activation energy limits the room-temperature DC conductivity of such doped glow discharge amorphous silicon and such material would have a large sheet resistance if it were made into a large area array, the resistance not being helped by the rather low carrier mobility which is a factor of about $10^4$ less than that for crystalline silicon. Also, where it is desirable to modify an amorphous silicon film to form an effective ohmic interface, for example, between an intrinsic (undoped) portion thereof and an outer metal electrode, such modified portions of the film must have a very high conductivity. It is apparent that the prior methods of doping such films which produced a conductivity of only $10^{-2}$ (ohm cm)$^{-1}$ would not provide a useful ohmic interface. (In contrast, the present invention enables the amorphous silicon and other films to be modified by the addition of conduction-increasing materials so that the conductivity is increased to $10^{-1}$ (ohm cm)$^{-1}$ or greater, which makes the films of this invention at least ten times better as ohmic interfaces between other portions of the films and metal electrodes.)

Thus, this prior deposition of amorphous silicon, which has been altered by hydrogen from the silane in an attempt to make it more closely resemble crystalline silicon and which has been doped in a manner like that of doping crystalline silicon, all done during the glow discharge deposition, has characteristics which in all important respects are inferior to those of doped crystalline silicon and cannot be used successfully in place of doped crystalline silicon.

While the amorphous semiconductor materials have many bonding options, the bonding of the amorphous semiconductor material, including the elements thereof, into the solid amorphous matrix can be primarily by covalent bonding, which is responsible for the strong bonds, so as to substantially maintain its integrity and its energy gap. As used herein, the normal structural bonding (NSB), which characterizes conventionally prepared amorphous materals, is the condition where each atom forms the optimal number of bonds, such as covalent bonds, primarily responsible for the cohesive energy of the amorphous solid. The energy gap ($EC-Ev$) is the difference in energy between the states at the bottom of the conduction band ($Ec$) and the top of the valence band ($Ev$). It is normally measured optically and is often referred to as the optical band gap ($E_o$). The energy gap is basically determined by the solid amorphous semiconductor materials forming the amorphous matrix and the structural configurations thereof.

A solid amorphous semiconductor material can have a wide spectrum of localized states in the energy gap, including bonding and nonbonding states, which are herein referred to as deviant or defect electronic configurations (DECs) and which have an effect upon the Fermi level, the electrical conductivity, and the electrical activation energy of the semiconductor material. Such defect electronic configurations can include substitutional impurities and vacancies, interstitials, dislocations, and so forth, which can occur principally in crystalline solids because of periodic restraints therein. In solid amorphous materials, three-dimensional orbital relationships can occur which are generally prohibited in crystalline materials by reason of the periodic constraints in the latter. Other defect electronic configurations, particularly in the amorphous semiconductor materials of this invention, can include microvoids and dangling bonds, dangling bond and nearest neighbor interactions, lone pairs, lone-pair/lone-pair interactions, lone pair and nearest neighbor interactions, valence alternation pairs, dative or coordinate bonds, charge compensation, polyvalency, lone-pair compensation, hybridization, three-center bonding, $\pi$ bonding, and others, all of which operate toward pinning and affecting the Fermi level in the energy gap of the materials and control the conduction process of the semiconductor materials.

The localized states in the energy gap and the electrical activation energy are related to the structural configuration of the amorphous matrix, to the nearest neighbor relationships of the elements in the amorphous matrix, to the aforementioned defect electronic configurations, and to electrically active centers in the amorphous matrix. The electrical activation energy $\Delta E$ is usually the energy difference between the Fermi level and the nearest band edge (valence band or conduction band) and without modification its value is often of the order of one-half the energy gap.

The principles of this invention are applicable, among others, to solid amorphous semiconductor matrices, including Group IV elements having normal tetrahedral bonding and three-dimensional stability, Group V elements having normal trivalent bonding and two-dimensional stability (i.e., sheets), and Group VI elements having normal divalent bonding and one-dimensional stability (i.e., chain and rings). Generally speaking, the Group V and VI amorphous materials do not contain microvoids and dangling bonds to the extent as do the Group IV amorphous materials and the Group IV amorphous materials do not contain lone pairs as do the Group V and VI amorphous materials. The presence of elements from Groups III or V in the semiconductors containing Group VI elements crosslink the chains thereof, and the presence of elements from Group IV in the semiconductors containing Group V or VI elements crosslink either the sheets of Group V or the chains and rings of Group VI, so that three-dimensional stability can be accomplished in the amorphous semiconductors containing the Groups V and VI elements. The amorphous semiconductor matrix involved in this invention can include combinations and complex alloys including the aforementioned elements and materials to tailor-make the energy gap for desired physical, thermal and optical purposes while being capable of being independently altered and modified to tailor-make the electronic configurations for desired electronic purposes.

The present invention has to do with the formation of an amorphous semiconductor film by depositing on a substrate a solid amorphous semiconductor host matrix wherein, for the first time, the density of localized states in the energy gap of the amorphous semiconductor material is so reduced as to be approximately equivalent to the corresponding crystalline material. This basic feature of this invention breaks the barrier which has prevented amorphous materials from functioning like crystalline materials and represents a significant improvement in the art. As a result, amorphous materials can have a number of the favorable attributes of crystalline semiconductor materials; they can provide high photoconductivity, and increased mobility, long diffusion length of the carriers, low dark intrinsic electrical conductivity, where desired, and they can be modified to shift the Fermi level to provide substantially n- or p-type extrinsic electrical conductivity, and the like. Thus, amorphous semiconductor materials can act like crystalline materials and be useful in devices, such as, solar cells and current controlling devices including p-n junction devices, diodes, transistors and the like.

Process aspects of the present invention provide amorphous semiconductor films, such as amorphous silicon films and the like, useful in the production of current control devices and solar cells, where the desired characteristics of these films are achieved without the previous referred disadvantages and limitations of the glow discharge of silane gas and sputter deposition processes described above. In the process of the preferred forms of the present invention, the quantity or quantities of the element or elements which form the basic amorphous semiconductor film and the quantity of the alterant elements believed to reduce the localized states in the energy gap thereof, are independently controllable. Also, they are generated in a form and incorporated into the amorphous film in a manner where they are activated and react most efficiently and effectively with the amorphous film. Additionally, the starting materials used to produce the element or elements which constitute an amorphous film are relatively inexpensive materials. Furthermore, in the preferred form of the present invention, the process of achieving an amorphous semiconductor film having a low density of undesired localized states is an easily controllable, reliable, rapid process, suitable for accurate production of altered amorphous semiconductor films. The quality of the amorphous semiconductor film produced is greatly improved. For example, the density of undesired localized states is reduced at least by a factor of 10 or more.

While the principles of this invention apply to the aforementioned various amorphous semiconductor materials, for purposes of illustration herein and as setting forth a preferred embodiment of this invention, specific reference is made to an amorphous semiconductor film utilizing silicon in the solid amorphous semiconductor matrix which is altered and modified and to a glow discharge decomposition method of depositing the same on a substrate. Here, a compound including silicon as an element thereof is decomposed by glow discharge decomposition to deposit amorphous silicon on a substrate along with the incorporation of a plurality of different alterant elements therein during the glow discharge deposition to alter the electronic configurations thereof to reduce the density of localized states in the energy gap to be more closely equivalent to that of crystalline silicon.

Such use of a plurality of different alterant elements not only decreases the density of localized states near the Fermi level in the energy gap as in the aforementioned glow discharge decomposition of silane, but to a greater extent, and, also, nearer the conduction band and the valence band which cannot be done by the aforementioned glow discharge decomposition of silane. By so reducing the density of localized states (which include dangling bonds, voids, traps and other defects) substantially throughout the energy gap, for the first time, an acceptable substitute for crystalline silicon is obtained, whereby the amorphous silicon semiconductor of this invention can have many of the favorable attributes of a crystalline silicon semiconductor as expressed above. The different alterant elements, incorporated in the amorphous silicon host matrix during the glow discharge decomposition of the silicon compound, in accordance with this specific embodiment of this invention, comprise hydrogen and fluorine, which are believed to reduce different localized states in the energy gap.

In this specific embodiment of the invention, the silicon compound comprises silicon tetrafluoride (SiF$_4$) which supplies silicon for the amorphous semiconductor host matrix and fluorine as one alterant element. While silicon tetrafluoride can form a plasma in a glow discharge, it is extremely difficult, if not impossible, to deposit silicon therefrom. The atmosphere for the glow discharge includes molecular hydrogen (H$_2$) which is made reactive by the glow discharge by changing it to atomic hydrogen or hydrogen ions or the like. This reactive hydrogen reacts in the glow discharge with the silicon tetrafluoride so as to readily cause decomposition thereof and deposit amorphous silicon therefrom on the substrate. At the same time, fluorine and various silicon subfluorides are released and made reactive by the glow discharge. The reactive hydrogen and the reactive fluorine species are incorporated in the amorphous silicon host matrix as it is being deposited and operate to satiate or cap the dangling bonds and other defects and in addition, alter the semiconductor matrix and in such a way that the number of defects formed is diminished. Hence, these alterant elements reduce substantially the density of the localized states in the energy gap, with the foregoing beneficial results accruing. Other compounds and compensating elements following the principles of this invention may be utilized and they will be referred to below. Briefly, the compounds may include other Group IV elements such as germanium, Group V elements such as arsenic, Group VI elements such as selenium, and combinations thereof. The alterant elements, in addition to hydrogen and fluorine, may include other Group VII halogen elements such as chlorine, rare earth elements such as gadolinium, erbium and europium, transition metals such as tungsten, and Group III and IV elements such as boron and carbon.

Since the density of localized states in the energy gap of the amorphous semiconductor host matrix is reduced in accordance with this invention to be the approximate equivalent of a crystalline semiconductor, the amorphous semiconductor host matrix may be also readily modified or doped, as desired, to change the electronic configurations thereof to introduce different localized states in the energy gap, as in crystalline semiconductors. Some of the modifier elements can act as donors or acceptors for shifting the Fermi level and others can act as sensitizers to enhance photoconductivity. This can be done by the incorporation of modifier elements in the amorphous semiconductor host matrix during the glow discharge deposition thereof, and this can involve the incorporation of the modifier elements in varying amounts, including small amounts (parts per million). These modifier elements can operate to change the amorphous semiconductor matrix from basically intrinsic conduction to extrinsic conduction, to shift the Fermi level in the energy gap toward the conduction band or the valence band for providing n-type or p-type conduction, and to sensitize or enhance the photoconductivity of the amorphous semiconductor host matrix.

The modifier elements can include Group V elements such as phosphorous and arsenic for providing n-type conduction and Group III elements such as boron, aluminum, gallium and indium for providing p-type conduction. Other elements incorporated in small amounts into the amorphous semiconductor host matrix as alterant elements, including, for example, non-tetrahedrally bonded boron and the like, can facilitate the modification or doping by the Group III modifier elements of the amorphous semiconductor host matrix for p-type conduction. The modifier elements can also include sensitizing elements such as zinc, copper, gold, silver, manganese for enhancing the photoconductivity of the amorphous semiconductor host matrix. Modifier elements, including the transition metal elements such as nickel, incorporated in the amorphous semiconductor host matrix can operate to increase the electrical conductivity thereof.

In the previously described silicon deposition processes involving the glow discharge of silane gas and the sputter depositing of amorphous silicon films, it was believed heretofore that only a single alterant element for reducing the density of localized states in the energy gap could be used, namely hydrogen subjected to the fixed deposition processes involved. In accordance with the present invention, it has been discovered that substantial reductions in the density of localized states, many of which also act as recombination centers, is achieved by utilizing two or more alterant elements which compliment one another. For example, it is believed that fluorine and hydrogen act as complimentary alterant elements which reduce the localized states of the energy gap to a degree markedly greater than could be achieved by the utilization of any amount of only one of the same.

In any amorphous semiconductor film the Fermi level cannot be moved almost completely to the valence or conduction band needed to make a good p-n junction unless the density of localized states in the energy gap is very low. In the attempted doping of the glow discharge deposition of silicon films from silane above described with an n-conductivity dopant, the Fermi level was moved to only within 0.2 eV of the conduction band, making the film of no commercial use in solar cells or current control devices. In the present invention, for example, the addition of a n-conductivity dopant, like arsenic, to an amorphous silicon film moves the Fermi level all of the way to the conduction band. The addition of a n-dopant like arsenic to an amorphous silicon film shifts the Fermi level to a point near the conduction band because the incorporation of the complimentary alterant elements, hydrogen and fluorine, have reduced the density of undesired localized states in the energy gap particularly in the upper half of the energy gap. Therefore, a good n-type conductivity amorphous silicon film results. To make a good p-type conductivity amorphous silicon film, it is necessary substantially to reduce the localized states in the lower half of the energy gap. An alterant element other than or in addition to hydrogen and fluorine are required for the latter purpose. For example, boron in non-tetrahedral coordination can reduce the density of localized states in the lower half of the energy gap, permitting an amorphous silicon film to be successfully doped with conventional p-conductivity dopant materials.

In the production of highly efficient solar cells, a large depletion region is favorable to enhance the absorption of photons which create electron-hole pairs. A large depletion region is obtained in an intrinsic film which possesses a relatively low density of localized states in the energy gap. Such an amorphous semiconductor film is useful in a Schottky barrier solar cell. However, when it is desired to form a p-n junction, it is necessary to add dopant conduction modifying agents, that is acceptor dopants, to move the Fermi level near the valence band in one part of the film and donor dopants in another part of the film to move the Fermi level close to the conduction band to form an effective solar cell p-n junction. In such case, a relatively small amount (parts per million) of dopant is added to the film. As previously indicated, a low density of undesired localized states (with an accompanying low density of recombination centers) enables the amorphous semiconductor film involved to be effectively doped, thusly, to form such effective p-n junctions useful in photo cells. To increase the photoconductive properties of amorphous semiconductor films further, the low density of localized states makes readily possible also the addition of sensitizing agents like zinc and copper to increase carrier lifetime. If a high dark conductivity is desired, much larger amounts of the conduction modifying agent would generally be added to the portion of the film which one wishes n or p conducting.

In summary, to bring the significance of the present invention into focus, it is believed that the present invention enables the fabrication of amorphous semiconductor films which are more similar to crystalline films for use in the manufacture of solar cells and current control devices including p-n junctions and the like, despite the previously accepted dogma that amorphous semiconductor materials could not be produced in a manner to be equivalent to their crystalline counterparts. Moreover, these films are produced under conditions where the amount and type of bonding of the alterant elements incorporated into the film are independently controlled. Additionally, the present invention provides large area, high yield, low cost amorphous semiconductor films. Finally, the films produced so as to provide maximum charge carrier separation and collection for solar cells produce such high energy conversion efficiencies that they should materially contribute to the solution of the energy shortage problems confronting the world to a greater degree each year.

The above-described and other objects, advantages, and features of the invention will become more apparent upon making reference to the specification to follow, the claims and the drawings.

FIG. 3 is a fragmentary view of a photoresponsive device, such as found in a Xerox drum, including an amorphous semiconductor film made in accordance with this invention.

FIG. 4 is a fragmentary view of a photodetection device which includes an amorphous semiconductor film made in accordance with this invention.

FIG. 5 is a fragmentary view of one embodiment of a solar cell to illustrate one application of the amorphous semiconductor film made in accordance with this invention and being directed to a Schottky barrier device.

FIG. 6 is a p-i-n solar cell device which includes an amorphous semiconductor film made in accordance with this invention.

FIG. 7 is a fragmentary view of a p-n junction solar cell device utilizing an amorphous semiconductor film made in accordance with this invention.

FIG. 8 is a heterojunction photovoltaic device including an amorphous semiconductor film made in accordance with this invention.

FIG. 9 is a graph setting forth curves plotting dark electrical conductivity, $\sigma(\Omega \text{ cm})^{-1}$, against inverse temperature, $10^3/T$, for various ratios of silicon tetrafluoride to hydrogen, $SiF_4/H_2$, in the reaction gas for showing decrease in the electrical conductivity for increase in hydrogen content in the reaction gas.

FIG. 10 is a graph setting forth curves for various ratios of $SiF_4/H_2$ in the reaction gas, giving (a) room temperature dark electrical conductivity, $\sigma_D(\Omega \text{ cm})^{-1}$ and (b) the electrical activation energy, $\Delta E(eV)$, and (c) the preexponent $\sigma_o$.

FIG. 11 is a graph setting forth a curve for various ratios of $SiF_4/H_2$ in the reaction gas giving $E_{04}(eV)$, the photon energy for which the absorption coefficient is $\alpha = 10^4 \text{ cm}^{-1}$.

FIG. 12 is a graph setting forth curves for various ratios of $SiF_4/H_2$ in the reaction gas giving the photoconductivity, $\sigma_P = \sigma_L - \sigma_D (\Omega \text{ cm})^{-1}$, where $\sigma_L$ is the electrical conductivity under light and $\sigma_D$ is the dark electrical conductivity, for two types of incident radiation, where $\sigma_P$ is measured (a) under AM-1 condition radiation, incident power of 90 mWcm$^{-2}$, and (b) under monochromatic radiation, radiation at $\lambda = 600$ nm with incident flux density of $N_o = 6 \times 10^{14} \text{s}^{-1} \text{ cm}^{-2}$.

FIG. 13 is a graph wherein (a) the curve is a plot of incident monochromatic radiation, $h\nu$ (eV), where h is a constant and $\nu$ is inversely proportional to the wavelength, versus the photocurrent expression $$\left[\frac{i_p h\nu}{e N_o (1-R)}\right]^{\frac{1}{2}},$$

and where the $E_o$ intercept defines the optical gap, and (b) the curve is a plot of the optical gap, $E_o(eV)$, for different ratios of $SiF_4/H_2$ in the reaction gas.

FIG. 14 is a graph which plots the amount of modification or doping of a $SiF_4 + H_2$ film of this invention in the p and n directions in (a) versus dark electrical conductivity, $\sigma_D$, and in (b) versus electrical activation energy, $\Delta E$.

FIG. 15 is a graph which plots the density of localized states in the energy gap, N(E), versus electron energy, E(eV) in the energy gap. $T_s$ is the substrate temperature.

Figure 1:
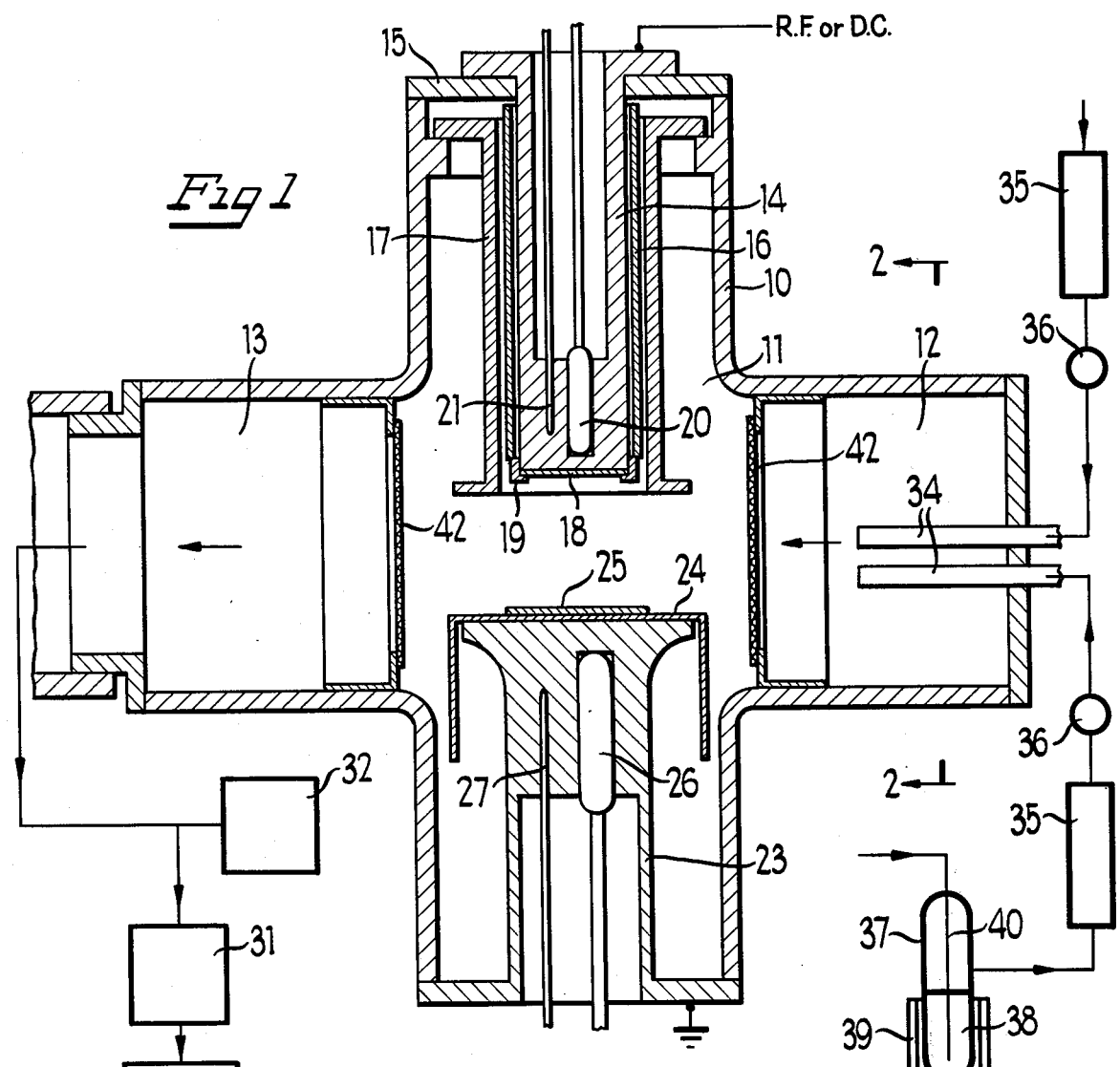
FIG. 1 is a diagrammatic illustration of an apparatus for the glow discharge decomposition of a compound to deposit a solid amorphous host matrix and to alter and modify the same.
Figure 2:
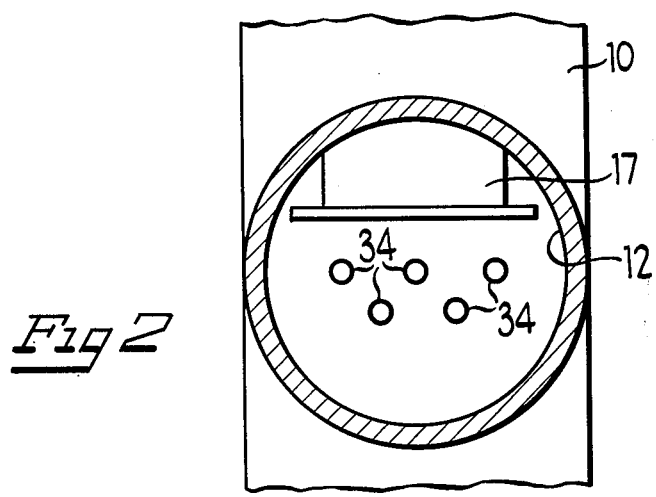
FIG. 2 is a sectional view through a portion of the apparatus illustrated in FIG. 1 and taken substantially along the line 2—2 of FIG. 1.

The method and apparatus for depositing the semiconductor host matrix by glow discharge deposition, diagrammatically illustrated in FIGS. 1 and 2, includes a housing 10 providing a vacuum chamber 11, an inlet chamber 12 and an outlet chamber 13. A cathode backing member 14 is mounted in the vacuum chamber 11 through an insulator 15 and it is circumferentially provided with an insulating sleeve 16 and a dark space shield 17. A substrate 18 is secured to the inner end of the cathode backing member 14 by a holder 19 which may be screwed onto the cathode backing member 14 in electrical contact therewith. The cathode backing member 14 is provided with a well receiving an electrical heater 20 for heating the same and a temperature responsive probe 21 for measuring the temperature of the cathode backing member 14. The temperature probe 21 is used in connection with the control of the energization of the heater 20 to maintain the cathode backing member 14 and hence the substrate 18 at desired selected temperatures.

The apparatus also includes an electrode 23 which is secured in the vacuum chamber 11 of the housing 10 in spaced relation to the cathode backing member 14. The electrode 23 is provided with a shield 24 which in turn carries a substrate 25. The electrode 23 is also provided with a well for receiving an electrical heater 26 and with a well receiving a temperature probe 27. The temperature probe 27 is used in connection with the control of the energization of the heater 26 to maintain the electrode 23 and hence the substrate 25 at desired selected temperatures. The space in the vacuum chamber 11 between the cathode backing member 14 and the electrode 23 provides for a glow discharge condition therebetween so as to produce a plasma therebetween. The cathode is electrically connected to a source of power comprising an R.F. or D.C. energy source which are regulatable and the electrode 23 is connected to ground to provide the desired glow discharge therebetween. The vacuum chamber 11 is evacuated by a vacuum pump 30 through a particle trap 31 and a pressure gauge 32 indicates the vacuum pressure in the vacuum chamber 11 which is used in connection with the control of the vacuum pump.

The inlet chamber 12 of the housing 10 is preferably provided with a plurality of conduits 34 for introducing materials into the housing 10 to be mixed therein and to be deposited in the vacuum chamber 11 by glow discharge decomposition between the cathode 14 and the electrode 23 on the substrates 18 and 25. If desired, the inlet chamber 12 could be located at a remote point for premixing the gases thereat before they are fed into the vacuum chamber 11 of the housing 10. The materials are fed to the conduits 34 through filters or purifying devices 35 under the control of valves 36. The valves 36 control the rate of admission of the materials into the vacuum chamber 11. Where a material which is not in gaseous form but in a liquid or solid form is to be utilized, it may be arranged within a closed container 37 as indicated at 38, the material 38 being heated by a heater 39 to increase the vapor pressure thereof so as to provide a vapor thereof in the container 37. A suitable gas is fed through a dip tube 40 into the material 38 so as to entrap vapors of the materials 38 and convey the same through the filter or purifying device 35 into its associated conduit 34 for introduction into the vacuum chamber 11. The inlet chamber 12 and the outlet chamber 13 are provided with screens 42 to confine the plasma in the vacuum chamber 11 principally between the cathode 14 and the electrode 23.

The materials fed through the conduits 34 and mixed in the inlet chamber 12 are subjected to the glow discharge decomposition between the cathode 14 and the electrode 23 in the vacuum chamber 11 so as to provide the desired glow discharge decomposition and the formation of the amorphous host matrix on the substrates 18 and/or 25 and the incorporation of the desired alterant and/or modifying materials therein.

In the operation of the apparatus illustrated in FIGS. 1 and 2, the system is first pumped down to a pressure less than about 20 m torr prior to deposition. A gas of silicon tetrafluoride (SiF$_4$) is fed into the inlet chamber 12 through one of the conduits 34 and molecular hydrogen gas (H$_2$) is fed into the inlet chamber 12 through another of the conduits 34, the two gases being premixed in the inlet chamber 12. The gas mixture is fed at a constant ratio of about 5-10 scc/min. into the vacuum chamber 11, the pressure of which is maintained within the range of about 1-2 torr. The partial pressure in the vacuum chamber 11 and the gases introduced therein provide an atmosphere therein which contains such gases. A plasma is generated in said atmosphere between the substrates 18 and 25 using either a D.C. voltage of greater than 1000 volts or by radio frequency power of about 50 watts, operating at 13.56 MHz or other desired frequency.

While a self-sustained plasma is obtained for SiF$_4$, SiF$_4$+Ar, SiF$_4$+H$_2$ gas mixtures, however, the deposition of a silicon film occurs on the substrates 18, 25 only for the last mixture including SiF$_4$+H$_2$. The introduction of H$_2$ is very important for a successful deposition of a film. This is due to the fact that in the plasma region between the substrates 18 and 25, the hydrogen molecules H$_2$ are disassociated into their atomic or ionic species. The H atoms or ions are very reactive and possess far too much energy for direct recombination. This energy is dissipated into an inelastic collision involving the SiF$_4$ molecules with the result that the SiF$_4$ molecules decompose into a variety of species such as atoms, sub-fluorides, free radicals, ions, both stable and unstable of the silicon and the fluorine. This decomposition into silicon occurs in a very active environment containing reactive hydrogen and reactive fluorine. The properties of the deposited silicon films on the substrates 18 and 25 vary markedly with the ratio of SiF$_4$ and H$_2$ in the starting mixture which is explained in a consistent manner on the basis of inclusion of H and F in the final deposit of the amorphous silicon. The decomposition of the amorphous films (the solid amorphous silicon host matrix) is accomplished and deposited at a nominal substrate temperature of about 380° C., although it is possible that the actual substrate temperature is somewhat lower.

The electrical conductivity of glow discharge deposited films can be described by the equation:

$$\sigma = \sigma_o \exp\left[-\frac{(\Delta E)}{kT}\right] + \sigma_o' \exp\left[-\left(\frac{T_o}{T}\right)^{\frac{1}{4}}\right]$$

The first term of the equation describes the conduction of thermally generated carriers into the extended states above $E_c$ (the conduction band) or below $E_v$ (the valence band). The second term of the equation represents conduction by hopping within the localized states of the energy band and this is predominant when the density of localized states is large, as with unaltered silicon or the like. The preexponent in the first term of the aforementioned equation is represented by:

$\sigma_o = e^\mu_e \, eN(E_c) \, kT \exp(\delta/k)$ for electrons
and
$= e^\mu_h \, eN(E_v) \, kT \exp(\delta/k)$ for holes where $N(E_c)$ and $N(E_v)$ are the effective densities of states at the conduction band mobility edge $E_c$ and of the valence band mobility edge $E_v$, respectively. $\mu_e$ and $\mu_h$ are the mobilities of electrons and holes, respectively, in the extended states. δ describes the temperature dependence of the band edges and k is a constant.

FIG. 9 shows a series of curves for log $\sigma$ vs. $10^3/T$ for several samples including the designated ratios of $SiF_4/H_2$ in the reaction gas, namely, 99:1, 80:1, 30:1 and 15:1. It is clear that as the $H_2$ content of the gas mixture is increased, the conduction mechanism in the films changes from an unactivated process involving hopping to a well defined activated process involving thermally generated carriers. The samples having the ratios 99:1 and 80:1 can be described by the second term in the aforementioned equation involving hopping and the samples involving the ratios 30:1 and 15:1 can be described by the first term of the aforementioned equation involving thermally generated charge carriers. It is thus seen that the electrical conductivity at room temperature of the various samples increases substantially as the H content in the samples increases.

FIG. 10 summarizes the parameters (a) room temperature dark conductivity $\sigma_D$, (b) the activation energy, $\Delta E$, and (c) the preexponent $\sigma_o$. The activation energy for samples having the ratios 99:1 and 80:1 as indicated in (b) are unactivated, as discussed above, while the other samples having the ratios 30:1 and 15:1 are activated. In order to obtain $\Delta E$ and $\sigma_o$ for $SiF_4/H_2$ greater than 80:1, tangents to the curves therefor in FIG. 9 at room temperature were drawn. This figure shows clearly that a transition in the conduction mechanisms occurs in the range $30/1 < SiF_4/H_2 < 80/1$. The factor $\sigma_o$ as shown in (c) changes by six orders of magnitude. The room temperature dark conductivity $\sigma_D$ decreases markedly as the $H_2$ content in the mixture increases. A minimum in the electrical conductivity $\sigma_D$ occurs at a ratio $SiF_4/H_2$ at about 15:1 and the electrical conductivity $\sigma_D$ increases with further reduction in the ratio.

FIG. 11 shows that the energy or band gap $E_{04}$ (defined as the photon energy at which the absorption coefficient $\alpha = 10^4$ cm$^{-1}$) increases as the ratio $SiF_4/H_2$ is decreased. There is a correlation between the ratio of $SiF_4/H_2$ in the gas mixture and the ratio of Si/H and the ratio of Si/F in the deposited film although, these correlations may not be a one-to-one correlation. When alloys are formed, the $E_{04}$ increases since hydrogen is incorporated into the film increasingly when the ratio $SiF_4/H_2$ is decreased. This results in an increase in the number of Si-H bonds and since these bonds are stronger than the Si-Si bonds, $E_{04}$ is therefor increased. The increase in the incorporation of hydrogen within the deposited film reflects in changes in the optical and electrical properties as is presented in FIGS. 9 to 11.

The least hydrogenated samples (99:1 and 80:1) exhibit an unactivated conduction, the conduction being n-type and yielding a localized state density greater than $10^{19}$ cm$^{-3}$ (eV)$^{-1}$. The conduction of such samples is dominated by hopping of electrons situated around the Fermi level. As the ratio $SiF_4/H_2$ is decreased, it is noted from FIGS. 9 and 10 that the electrical conductivity decreases by orders of magnitude and the change to a well-defined activation energy takes place. These samples remain n-type and the conduction mechanism is electron conduction within the extended states at the conduction band. The above transition from a hopping conduction to a well activated conduction is due to hydrogen and fluorine incorporation into the amorphous silicon film. The localized states originate from a variety of sources, such as dangling bonds, voids, defects, etc. With increased hydrogen inclusion, the dangling bonds are satiated to alter the semiconductor matrix in such a way that the density of localized states is reduced. When a sufficient reduction takes place, a transition in the conduction mechanism, of the above type, occurs.

It is generally known that in the weakly absorbing part of the energy spectrum, such that $\alpha d$ is less than 1 where $\alpha$ is the absorption coefficient (cm$^{-1}$) and d (microns) is the thickness of film, the photocurrent in the film can be expressed in the following way, $$\left[ \frac{I_p h\nu}{eN_o(1-R)} \right]^{\frac{1}{2}} = \text{constant} \times (h\nu - E_o)$$

where $I_p$=photocurrent, h=Plancks constant, $\nu$=inverse proportional to the wave length of the incident radiation, $N_o$=incident flux density of the radiation, R=reflection coefficient, e=electronic charge and $E_o$=optical gap. FIG. 13(a) shows a plot of these parameters. Extrapolating the well-defined straight region leads to an intercept on the $h\nu$ axis, which yields the optical gap, $E_o$. FIG. 13(b) shows the variation of $E_o$ with $SiF_4/H_2$. There is a general increase in optical gap, $E_o$, with increasing hydrogen incorporation and agrees well with $E_{04}$ variation with variation of the $SiF_4/H_2$ ratio. The highly photoconducting films occur when the ratio $SiF_4/H_2$ is about 10:1. This is shown in FIGS. 12(a) and (b) for two types of incident radiation where $\sigma_P$ is plotted as a function of $SiF_4/H_2$ gas ratio. When these films were subjected to prolonged AM-1 radiation, no photostructural change with respect to its properties was noted.

As expressed above, the glow discharge deposition of the amorphous silicon film from silicon tetrafluoride in an atmosphere containing hydrogen, wherein the hydrogen and fluorine are made reactive by the glow discharge and are incorporated into the film for altering the same, gives drastically improved results over silicon films formed by glow discharge of silane. This is graphically illustrated in FIG. 15 wherein the density of states, $N(E)$ cm$^{-3}$eV$^{-1}$, as a function of electron energy $E(eV)$ between the conduction band $E_c$ and the valence band $E_v$ is plotted for the two films. The solid curve shows the film deposited from silane ($SiH_4$) at a substrate temperature of about 520° K. and the dotted curve shows the film deposited from silicon tetrafluoride ($SiF_4$) in an atmosphere containing hydrogen $H_2$ having $SiF_4/H_2$ gas ratio of 10:1 at a substrate temperature of about 550° K.

It is first noted that the density of localized states of the $SiF_4/H_2$ film is considerably less than that of the $SiH_4$ film, the former being in the range of $10^{16}$ cm$^{-3}$ eV$^{-1}$ and the latter being in the range of $10^{17}$ cm$^{-3}$ eV$^{-1}$. These densities of states are determined by the field effect technique and these numbers represent upper limits. It is also noted in FIG. 15 that the $SiH_4$ film has a hump or bump at substantially 0.4 eV of the energy gap which hinders by subsequent doping the shifting of the Fermi level by doping much beyond this point and not beyond an energy gap value of 0.2 eV. However, in the $SiF_4/H_2$ film of this invention, the bump is completely eliminated so that the Fermi level can be shifted substantially to the conduction band $E_C$. This is due to the combined use of the hydrogen and the fluorine as alterant elements in the semiconductor film of this invention and is an important factor of this invention. It is, therefore, possible in the $SiF_4/H_2$ produced film to readily modify or dope the film to shift the Fermi level substantially as desired.

In the SiH$_4$ produced film, there is also a hump at the 1.2 eV value in the energy gap which prevents the shifting of the Fermi level much therebeyond toward the valence band E$_v$. By utilizing other alterant elements during the glow discharge deposition of the SiF$_4$/H$_2$ film a curve corresponding to the dotted curve extending toward the valence band could also be provided. Such other alterant elements could include, for example, non-tetrahedrally bonded boron, so that with such additional alterant elements the Fermi level could also be shifted substantially to the valence band by suitable doping. This further reduction of localized states in the gap near the conduction band and the valence band make the amorphous semiconductor film of this invention the substantial equivalent of crystalline semiconductors so that the amorphous semiconductor material of this invention may be readily modified or doped as in crystalline semiconductors to obtain all of the favorable attributes thereof.

In this connection, reference is made to FIG. 14, wherein modifying or doping of the semiconductor material of this invention with arsene (AsH$_3$) toward n-type conductivity and with diborane (B$_2$H$_6$) toward the p-type conductivity are illustrated. In 14(a) the undoped semiconductor of this invention has an electrical conductivity of about $10^{-7}$ ($\Omega$ cm)$^{-1}$ and in FIG. 14(b) it has an electrical activation energy of about 0.6 eV. When the semiconductor material is doped with arsine in small amounts, parts per million, the dark electrical conductivity increases substantially which establishes that the Fermi level may be readily and easily shifted to the conduction band with a minimal amount of modification or doping. Also, as shown in FIG. 14(b) the electrical activation energy $\Delta E$ is substantially reduced by the use of small amounts of such dopant or modifier.

Where, however, diborane is used as the dopant toward p-type conductivity relatively large amounts of dopant or modifier material are required. This p-type dopant first acts to decrease the dark electrical conductivity and to increase the electrical activation energy to a point where the ratio of the diborane to the SiF$_4$+H$_2$ amounts to about $10^{-4}$. At the same time, the electrical activation energy is increased. Thereafter, further decreases in the ratio operate to increase the electrical conductivity and decrease the electrical activation energy as seen from FIG. 14. Considerably more doping toward the p-type conductivity is required, this being due to the density of states near the valence band. As expressed above, the amount of doping toward the p-type conductivity, may be decreased substantially by utilizing a further alterant material for decreasing the density of states near the valence band.

Thus, in accordance with this invention, the use of SiF$_4$/H$_2$ as the gases to be decomposed by glow discharge, in addition to decreasing the density of states in the energy gap also provide for ready shifting of the Fermi level with small amounts of dopants or modifierss at least to the conduction band. The dopants or modifiers arsine and diborane are supplied through appropriate conduits 34 into the inlet chamber 12 where they may be premixed into the SiF$_4$+H$_2$ gas so that they are incorporated in the amorphous silicon film as the same is being glow discharge deposited in the vacuum chamber 11. The glow discharge breaks up these gases into a variety of species, such as atoms, free radicals, ions, both stable and unstable including arsenic from the arsine or boron from the diborane, which are incorporated as modifiers into the amorphous film while the same is being deposited.

Due to the nature of the amorphous semiconductor films of this invention, which substantially simulate crystalline semiconductors, having relatively low dark electrical conductivity, relatively high light electrical conductivity or photoconductivity, ease of modification or doping for n and p-type conduction and shifting of the Fermi level to the conduction and valence bands, and increased carrier drift mobility, including hole mobility as well as electron mobility, it is possible, for the first time, to make commercially acceptable amorphous semiconductor devices. Examples of some of such devices are diagrammatically illustrated in FIGS. 3 to 8.

FIG. 3 diagrammatically illustrates a fragment of a photoresponsive device such as found on a Xerox drum, including an altered amorphous semiconductor film 51 made in accordance with this invention which is deposited on a metal substrate 50. The metal substrate 50 is highly conductive and selected to provide ohmic contact 52 with the amorphous semiconductor film 51. The amorphous semiconductor material in this example is of the n-type conductivity. Preferably in depositing the film 51 on the substrate 50 it is deposited n+ as indicated at 51' so as to provide an n to n+ junction 52' to assure a low ohmic contact between the film 51 and the substrate 50. In Xerox use, the film 51 is normally charged and the film of the invention retains its charge because of the relatively low dark electrical conductivity thereof. When, however, the film is imagewise subjected to light radiation, the electrical conductivity thereof is increased where so radiated so as to release the charge thereat and this is made possible by the relatively high light electrical conductivity or photoconductivity of this invention. The differences in the charged and uncharged portions of the film control a toner applied to the film providing suitable images in a xerographic process.

FIG. 4 diagrammatically illustrates a photodetection device which includes an amorphous semiconductor film 51 of this invention applied or deposited on a metal substrate 50 at 52. A light transmitting metal film 53, is applied to the semiconductor film 51 to form an electrode therefor. The film 53 has good electrical conductivity as does the substrate 50. Electrodes 55 are provided for applying a voltage across the film 53 and substrate 50 which is normally blocked by reason of the relatively low dark electrical conductivity of the film 51. An anti-reflection layer 56 may be applied over the film 53 and electrodes 55. When incident radiation is applied to the device of FIG. 4, the device will conduct current because of the relatively high light electrical conductivity or photoconductivity of the film of the invention. Thus, a current in a circuit may be controlled in accordance with the amount of incident radiation applied to the device. In order to assure ohmic contact between the film 51 which has n-type conductivity and the metal film 53 and substrate 50, the film 51 is modified or doped n+ at 51', the surfaces between the film 51 and the n+ doped portions 51' being indicated at 52' and 54'.

FIG. 5 is a diagrammatic illustration of a Schottky barrier type solar cell. It includes a metallic substrate 50 on which is deposited at 52 a semiconductor film 51 of this invention. In order to insure good ohmic contact between the semiconductor film 51 and the metal substrate 50, the film 51 is highly doped n+ indicated at 51', the juncture of the film 51 and the highly doped portion 51' thereof being indicated at 52'. A metallic film 58 is deposited at 59 on the semiconductor film 51 and the metallic film 58 is transparent to solar radiation and is of a metallic material with good electrical conductivity and of a high work function, as for example, platinum, paladium, chromium, iridium or rhodium. On the surface of the metallic film 58 is a grid type electrode 60 having good electrical conductivity. The function of the grid electrode 60 is for the uniform collection of current from the metallic layer 58. An antireflection layer 61 which is transparent is deposited over the metallic film 58 and electrode 60.

A Schottky barrier is formed at the interface 59 by contacting the metallic film 58 with the amorphous film 51. The Schottky barrier generates a space charge region in the semiconductor material 51 which penetrates into the same from the interface. The space charge region is also referred to as the depletion region and preferably the depletion region extends the entire width of the semiconductor film 51. Carriers created anywhere in the film 51 as a result of the absorption of solar radiation are swept by the electric field in the depletion region to enter the metallic substrate 50 or the metallic film 58. In this way, a photovoltaic current is produced which can be introduced into a circuit connected to the metallic substrate 50 and the grid type electrode 60.

A photovoltaic device and more particularly a p-i-n solar cell is diagrammatically illustrated in FIG. 6. It includes a semiconductor film 66 made in accordance with this invention deposited on a metallic substrate 65. The semiconductor film 66 includes a portion 67 which is doped or modified to be n-type, a central portion 68 which is essentially intrinsic although it is slightly n-type and a modified or doped p-type portion 69. A transparent metallic film 70 is deposited over the semiconductor film 66, the substrate 65 and the film 70 operating as electrodes for conducting current generated by the photovoltaic device. In order to provide an ohmic contact between the metallic substrate 65 and the n doped portion 67, the portion 67 is highly doped n+ as indicated at 67'. Likewise, in order to provide ohmic contact with the metallic film 70, the p doped portion 69 of the semiconductor film is highly doped p+ as indicated at 69'.

In such a p-i-n solar cell, as a result of the equalization in Fermi levels between portions 69, 67 and 68 there is a negative space charge in the portion 69 and a positive space charge in the portion 67 and the formation of built-in potential between the portions 69 and 68 and 67 and 68, and also the formation of a depletion region in the intrinsic portion 68. Preferably, the depletion region extends through the intrinsic portion 68 and, therefore, any carriers generated in the intrinsic portion 68 by the absorption of solar radiation will be swept up in the electric field of the depletion region and collected as an electrical current.

A p-n junction solar cell device is illustrated in FIG. 7. This photovoltaic device includes a metallic substrate 75 and an amorphous semiconductor material 76 made in accordance with this invention. The semiconductor film 76 includes a portion 77 which contacts the metal substrate 75 and which is highly doped n+ to make ohmic contact at 78 with the portion 79 which is doped n-type. The film also includes a portion 80 which is doped p-type to provide a p-n junction 81 between the portions 79 and 80. The p-type doped layer 80 is further highly doped p+ as indicated at 80' so as to provide an ohmic contact with a transparent metallic film 83 contacting the semiconductor film 76. In the operation of this photovoltaic device, solar radiation enters the device through the transparent metallic film 83 and some of the solar radiation is absorbed in the semiconductor film 76 forming electron-hole pairs. These current carriers then diffuse to the p-n junction 81 and if they arrive at the space charge region of the p-n junction, before recombining they are collected and contribute to the current generated by the device.

FIG. 8 is a diagrammatic illustration of a heterojunction photovoltaic device including an amorphous semiconductor film 88 made in accordance with this invention. The film has n-type conductivity and it is provided with a highly doped n+ portion 86 where it contacts a metal substrate 85 so as to provide an ohmic contact 87 for the amorphous film 88. The device also includes a semiconductor film 89 joining the film 88 at 90. The film 89 may be of a different material than the film 88 and has a high band gap so as to be transparent to solar radiation impinging the same. The differences in band gap between the films 88 and 89 provide a large potential barrier in the vicinity of the junction 90, which forms a heterojunction, for the generation of a large open circuit voltage. The differences in the band gap produce band bending at the heterojunction 90. The semiconductor material 89 is heavily doped so as to provide substantially ohmic contact with electrodes 91. Because the semiconductor film 89 is highly doped, the electrical field generated by the potential barrier at the heterojunction 90 will not penetrate substantially into the film 89 but will penetrate substantially into the film 88. Accordingly, most of the space charge region, i.e. the depletion region, will be generated in the semiconductor film 88. Solar radiation which is absorbed within the depletion region in the semiconductor film 88 will generate electron-hole carriers which will be swept by the electrical field to either the electrode 91 or the substrate 85, thereby generating the electric current of the device.

In the formation of devices, such as in FIGS. 3 to 8 the composition of the gases being decomposed can be rapidly changed such that any desired sequence of layers with different characteristics, such as, substantially intrinsic, p-type and n-type, p+-type and n+-type, can be fabricated by the glow discharge process of this invention.

As expressed above, other compounds than silicon tetrafluoride glow discharge decomposed in an atmosphere of hydrogen can be utilized in accordance with this invention.

Where the glow discharge decomposition of a compound containing silicon and involving different alterant elements, such as hydrogen and fluoride are involved, in addition to utilizing silicon tetrafluoride in an atmosphere containing hydrogen ($SiF_4 + H_2$), other compounds and atmospheres may be utilized, as for example, $SiH_4 + SiF_4$ $SiH_4 + F_2$ $SiHF_3 + H_2$ or $F_2$ $SiH_2F_2 + H_2$ or $F_2$ $SiH_3F + H_2$ or $F_2$ where hydrogen and fluorine form the alterant elements incorporated into the amorphous semiconductor silicon host matrix.

Other elements of compounds and elements in the atmosphere include:

$SiHCl_3 + F_2$ $SiH_2Cl_2 + F_2$ $SiH_3Cl + F_2$ $SiCl_3F + H_2$ $SiCl_3F_2 + H_2$ $SiClF_3 + H_2$ wherein chlorine, hydrogen and fluorine are alterant elements incorporated in the amorphous silicon host matrix.

Instead of utilizing the Group IV element, silicon (Si) another Group IV element may be utilized such as germanium (Ge) by glow discharge decomposition of the following compounds in the following atmosphere:

$GeH_4 + F_2$ $GeF_4 + H_2$ where germanium (Ge) is the basic element of the host matrix and where alterant elements of hydrogen and fluorine are incorporated therein for alteration purposes.

In another form of the invention, the compounds $AsH_3 + H_2Se$ may be glow discharge decomposed in an atmosphere containing $F_2$ to provide an arsenic—selenium alloy, involving Group V and the Group VI elements, which are altered by hydrogen and fluorine to obtain the beneficial results of this invention.

In still another form of this invention $AsH_3$ may be glow discharge decomposed in an atmosphere containing $F_2$ to provide an amorphous matrix of arsenic (a Group V element) which is altered by the inclusion of hydrogen and fluorine.

In a further form of this invention, compounds of $(CH_3)_3Ga + AsH_3$ in an atmosphere containing $F_2$ to provide an amorphous semiconductor host matrix comprising a gallium-arsenic alloy which is altered by the inclusion of hydrogen and fluorine. The amorphous host matrix alloy includes Group III and Group V elements.

Another example includes the glow discharge decomposition of compounds $(CH_3)_3In$ and $PH_3$ in an atmosphere containing $F_2$. This produces an indium phosphorus alloy which is altered by the inclusion of hydrogen and fluorine, the amorphous semiconductor alloy containing Group III and Group V elements.

In a further example of this invention, which is capable of withstanding high temperatures, compounds of $B_2H_6$ and $NH_3$ in an atmosphere containing $F_2$ can provide an amorphous semiconductor host matrix comprising a boron-nitrogen alloy which is altered by the inclusion of hydrogen and fluorine.

In this same respect, compounds of $SiH_4$ and $C_2H_6$ in an atmosphere containing $F_2$ provides a host matrix comprising a silicon-carbon alloy which is altered by the inclusion of hydrogen and fluorine.

Further in this same respect, compounds of $SiF_4$ and $C_2H_6$ in an atmosphere containing $H_2$ or $F_2$ provide an amorphous semiconductor comprising a silicon-carbon alloy which is altered by the inclusion of hydrogen and fluorine.

For providing n-type modification or doping, in addition to using arsine ($AsH_3$), there may also be utilized phosphine ($PH_3$), ammonia ($NH_3$) of the like, as a gas for supplying phosphorous and nitrogen as the donors. Here, the phosphorous and nitrogen included in the film are obtained from these gases.

In addition to utilizing diborane ($B_2H_6$) for p-type modification or doping, for example, $Ga(CH_3)_3$ or $(C_2H_5)_3Al$, or the like may be utilized. Here, the gallium and the aluminum included in the film are obtained from these gases.

While for purposes of illustration, several forms of this invention have been disclosed, other forms thereof may become apparent to those skilled in the art upon reference to this disclosure and, therefore, this invention is to be limited only by the scope of the appended claims.

We claim:

1. The method of making a semiconductor film comprising a solid amorphous semiconductor host matrix including at least one element and having electronic configurations which have an energy gap and a density of localized states therein, said method comprising depositing on a substrate a solid amorphous semiconductor host matrix including at least one element by glow discharge decomposition of a compound containing said at least one element and at least one alterant element in a partial vacuum having an atmosphere separately containing at least one different alterant element and not derived from the compound, wherein said different at least one alterant elements of said compound and separately contained in said atmosphere comprise at least fluorine and are incorporated in said amorphous semiconductor host matrix during deposition thereof yielding an altered amorphous semiconductor material having altered electronic configurations with a reduced density of localized states in the energy gap.

2. The method as defined in claim 1 wherein said alterant elements are made reactive by the glow discharge.

3. The method as defined in claim 1 comprising controlling the relative amounts of said compound and said alterant elements.

4. The method as defined in claim 1 comprising controlling the temperature of deposition of the solid amorphous semiconductor host matrix.

5. The method as defined in claim 1 wherein said alterant elements comprise at least hydrogen and fluorine.

6. The method as defined in claim 1 wherein said alterant elements comprise at least rare earth elements, transition metal elements, chlorine, boron or carbon.

7. The method as defined in claim 1 wherein said at least one element of the amorphous semiconductor host matrix comprises silicon.

8. The method as defined in claim 1 wherein said at least one element of the amorphous semiconductor host matrix comprises germanium.

9. The method as defined in claim 1 wherein said at least one element of the amorphous semiconductor host matrix comprises a Group III element.

10. The method as defined in claim 1 wherein said at least one element of the amorphous semiconductor host matrix comprises a Group V element.

11. The method as defined in claim 1 wherein said at least one element of the amorphous semiconductor host matrix comprises a Group VI element.

12. The method as defined in claim 1 wherein the compound comprises silicon tetrafluoride and wherein the alterant element separately contained in the atmosphere comprises hydrogen.

13. The method as defined in claim 1 wherein the atmosphere for the glow discharge decomposition separately contains a modifier element which is incorporated in said amorphous semiconductor host matrix during formtion thereof yielding a modified amorphous semiconductor material having modified electronic configurations with the introduction of localized states in the energy gap.

14. The method as defined in claim 13 wherein the modified amorphous semiconductor material is such that the Fermi level is moved to the vicinity of either the valence band or the conduction band.

15. The method as defined in claim 14 wherein the modifier element is obtained from arsine during the glow discharge deposition of the amorphous semiconductor host matrix.

16. The method as defined in claim 14 wherein the modifier element is obtained from phosphine, ammonia, $Ga(CH_3)_3$ or $(C_2H_5)_3Al$.

17. The method as defined in claim 13 wherein said modifier element is made reactive by the glow discharge.

18. The method as defined in claim 13 wherein said alterant elements and said modifier element are made reactive by the glow discharge.

19. The method as defined in claim 13 comprising controlling the relative amounts of said compound and said modifier element.

20. The method as defined in claim 13 wherein said modifier element comprises Group V elements or Group III elements for p or n-type conduction.

21. The method as defined in claim 13 wherein said modifier element comprises zinc, copper, gold, silver or manganese for enhancing photoconductivity.

22. The method as defined in claim 13 wherein said modifier element comprises transition metal elements for increasing electrical conductivity.

23. The method of making a semiconductor film comprising a solid amorphous semiconductor host matrix including at least one element and having electronic configurations which have an energy gap and a density of localized states therein, said method comprising depositing on a substrate a solid amorphous semiconductor host matrix including at least one element by glow discharge decomposition of a plurality of compounds, each containing said at least one element and at least one different alterant element, wherein said different at least one alterant elements of said compounds comprise at least fluorine and are incorporated in said amorphous semiconductor host matrix during deposition thereof yeilding an altered amorphous semiconductor material having altered electronic configurations with a reduced density of localized states in the energy gap.

24. The method as defined in claim 23 wherein said alterant elements are made reactive by the glow discharge.

25. The method as defined in claim 23 wherein said alterant elements comprise at least hydrogen.

26. The method as defined in claim 23 wherein the plurality of compounds comprise silicon tetrafluoride and silane.

27. The method as defined in claim 23 wherein the atmosphere for the glow discharge decomposition separately contains a modifier element which is incorporated in said amorphous semiconductor host matrix during the formation thereof yielding a modified amorphous semiconductor material having modified electronic configurations with the introduction of localized states in the energy gap, such that the Fermi level is moved to the vicinity of either the valence band or the conduction band.

28. The method as defined in claim 27 wherein said modifier element is made reactive by the glow discharge.

29. The method of making a semiconductor film comprising a solid amorphous semiconductor host matrix including at least one element and having electronic configurations which have an energy gap and a density of localized states therein, said method comprising depositing on a substrate a solid amorphous semiconductor host matrix including at least one element by glow discharge decomposition of a plurality of compounds, each containing said at least one element and at least one alterant element, in a partial vacuum having an atmosphere separately containing at least one different alterant element and not derived from the compounds, wherein said different at least one alterant elements of said compounds and separately contained in said atmosphere comprise at least fluorine and are incorporated in said amorphous semiconductor host matrix during deposition thereof yielding an altered amorphous semiconductor material having altered electronic configurations with a reduced density of localized states in the energy gap.

30. The method as defined in claim 29 wherein said alterant elements are made reactive by the glow discharge.

31. The method as defined in claim 29 wherein said alterant elements comprise at least hydrogen and fluorine.

32. The method as defined in claim 29 wherein the plurality of compounds comprise silicon tetrafluoride and silane and the alterant elements separately contained in the atmosphere comprise at least hydrogen or fluorine.

33. The method as defined in claim 29 wherein the atmosphere for the glow discharge decomposition separately contains a modifier element which is incorporated in said amorphous semiconductor host matrix during the formation thereof yielding a modified amorphous semiconductor material having modified electronic configurations with the introduction of localized states in the energy gap such that the Fermi level is moved to the vicinity of either the valence band or the conduction band.

34. The method as defined in claim 33 wherein said modifier element is made reactive by the glow discharge.

35. The method of making a semiconductor film comprising a solid amorphous alloy semiconductor host matrix including a plurality of elements and having electronic configurations which have an energy gap and a density of localized states therein, said method comprising depositing on a substrate a solid amorphous alloy semiconductor host matrix including a plurality of elements by glow discharge decomposition of a plurality of compounds, each containing at least one of said elements and at least one alterant element, in a partial vacuum having an atmosphere separately containing at least one different alterant element and not derived from the compounds, wherein said different at least one alterant elements of said compounds and separately contained in said atmosphere comprise at least fluorine and are incorporated in said amorphous alloy semiconductor host matrix during deposition thereof yielding an altered amorphous alloy semiconductor material having altered electronic configurations with a reduced density of localized states in the energy gap.

36. The method as defined in claim 35 wherein said alterant elements are made reactive by the glow discharge.

37. The method as defined in claim 35 wherein said alterant elements comprise at least hydrogen.

38. The method as defined in claim 35 wherein the amorphous alloy semiconductor material includes elements from Groups III, IV, V and VI of the periodic table.

39. The method as defined in claim 35 wherein the amorphous alloy semiconductor material includes boron, carbon or nitrogen to withstand high temperatures.

40. The method as defined in claim 35 wherein the atmosphere for the glow discharge decomposition separately contains a modifier element which is incorporated in said amorphous alloy semiconductor host matrix during the formation thereof yielding a modified amorphous alloy semiconductor material having modified electronic configurations with the introduction of localized states in the energy gap, such that the Fermi level is moved to the vicinity of either the valence band or the conduction band.

41. The method as defined in claim 40 wherein said modifier material is made reactive by the glow discharge.

42. The method of producing an amorphous semiconductor film comprising a solid amorphous semiconductor host matrix with electronic configurations which have an energy gap and a low density of localized states therein, said method comprising depositing on a substrate a solid amorphous semiconductor host matrix by glow discharge decomposition of at least one compound and incorporating in said amorphous semiconductor host matrix during deposition thereof a plurality of different complementary alterant elements, including at least fluorine, yielding an altered amorphous semiconductor material having altered electronic configurations with a reduced density of localized states in the energy gap.

43. The method as defined in claim 42 wherein the reduced density of localized states occur near the center of the energy gap and in the upper half and/or the lower half of the energy gap.

44. The method as defined in claim 42 wherein said alterant elements are made reactive by the glow discharge.

45. The method as defined in claim 42 wherein said compensating elements comprise at least hydrogen.

46. The method as defined in claim 42 comprising incorporating in said amorphous semiconductor host matrix during deposition thereof a modifier element yielding a modified amorphous semiconductor material having modified electronic configurations with the introduction of localized states in the energy gap.

47. The method as defined in claim 43 comprising incorporating in said amorphous semiconductor host matrix during deposition thereof a modifier element yielding a modified amorphous semiconductor material having modified electronic configuration with the introduction of localized states in the energy gap, such that the Fermi level is moved to the vicinity of either the valence band or the conduction band.

48. The method as defined in claim 46 wherein said modifier element is made reactive by the glow discharge.

49. The method of making a semiconductor film comprising a solid amorphous semiconductor host matrix including at least one element and having electronic configurations which have an energy gap and a density of localized states therein, said method comprising depositing on a substrate a solid amorphous semiconductor host matrix including at least one element by glow discharge decomposition of a compound containing said at least one element and at least one alterant element comprising fluorine in a partial vacuum having an atmosphere separately containing at least one alterant element different from said at least one alterant element of the compound, wherein said at least one different alterant element separately contained in the atmosphere facilitates the glow discharge decomposition of said compound and deposition of said amorphous semiconductor host matrix, and wherein said at least one alterant element of said compound is incorporated in said amorphous semiconductor host matrix during deposition thereof yielding an altered amorphous semiconductor material having altered electronic configurations with a reduced density of localized states in the energy gap.

50. The method as defined in claim 49 wherein said alterant elements are made reactive by the glow discharge.

51. The method as defined in claim 49 wherein said at least one element of the amorphous semiconductor host matrix includes silicon.

52. The method as defined in claim 49 wherein said compound includes silicon and fluorine and said atmosphere includes hydrogen.

53. The method as defined in claim 52 wherein said compound comprises silicon tetrafluoride.

54. The method of making a semiconductor film comprising a solid amorphous semiconductor host matrix including silicon and having electronic configurations which have an energy gap and a density of localized states therein, said method comprising depositing on a substrate a solid amorphous semiconductor host matrix including silicon by glow discharge decomposition of a compound containing silicon and an alterant element including fluorine, wherein said alterant element of said compound is incorporated in said amorphous semiconductor host matrix during deposition thereof yielding an altered amorphous semiconductor material having altered electronic configurations with a reduced density of localized states in the energy gap.

55. The method as defined in claim 49 wherein the atmosphere for the glow discharge decomposition separately contains a modifier element which is incorporated in said amorphous semiconductor host matrix in parts per million during formation thereof yielding a modified amorphous semiconductor material having modified electronic configurations with the introduction of localized states in the energy gap.

56. The method as defined in claim 55 wherein the modified amorphous semiconductor material is such that the Fermi level is moved to the vicinity of either the valence band or the conduction band.

57. The method as defined in claim 55 wherein said modifier element is made reactive by the glow discharge.

* * * * *

UNITED STATES PATENT AND TRADEMARK OFFICE
CERTIFICATE OF CORRECTION

PATENT NO. : 4,226,898
DATED : Oct. 7, 1980
INVENTOR(S) : Stanford R. Ovshinsky et al.

It is certified that error appears in the above—identified patent and that said Letters Patent is hereby corrected as shown below:

The term of this patent subsequent to August 12, 1997 has been disclaimed.

Signed and Sealed this

Sixth Day of January 1981

[SEAL]

Attest:

SIDNEY A. DIAMOND

Attesting Officer

Commissioner of Patents and Trademarks

UNITED STATES PATENT AND TRADEMARK OFFICE
CERTIFICATE OF CORRECTION

PATENT NO. : 4,226,898
DATED : October 7, 1980
INVENTOR(S) : Stanford R. Ovshinsky, Bloomfield Hills; Arun Madan, Rochester, both of Michigan It is certified that error appears in the above—identified patent and that said Letters Patent is hereby corrected as shown below:

Column 4, line 48, "materals" should be --materials--;
line 51, "EC" should be --Ec--;
Column 5, line 36, "chain" should be --chains--;
Column 18, line 56, "fluoride" should be --fluorine--;
Column 19, line 6, the first occurrence of "elements" should be --examples--;
line 17, "SiCl3F2" should be "SiCl2F2--;
Claim 1, line 16, "yelding" should be --yielding--;
Claim 5, lines 2 and 3, delete "and fluorine";
Claim 13, line 4, "formtion" should be --formation--;
Claim 31, lines 2 and 3, delete "and fluorine".

Signed and Sealed this

Twenty-second Day of January 1985

[SEAL]

Attest:

DONALD J. QUIGG

Attesting Officer     Acting Commissioner of Patents and Trademarks